(12) United States Patent
Wiseman (10) Patent No.: US 7,470,614 B1
(45) Date of Patent: Dec. 30, 2008

(54) METHODS FOR FABRICATING SEMICONDUCTOR DEVICES AND CONTACTS TO SEMICONDUCTOR DEVICES

(75) Inventor: Joseph William Wiseman, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 188 days.

(21) Appl. No.: 11/355,474

(22) Filed: Feb. 15, 2006

(51) Int. Cl.
*H01L 21/4763* (2006.01)

(52) U.S. Cl. .................. 438/637; 438/555; 438/672; 438/942; 257/311; 257/797; 257/E21.018; 257/E21.507

(58) Field of Classification Search .............. 438/584, 438/555, 618, 622, 637, 672, 942, 396, 397; 257/311, 797, E21.018, E21.507, E21.577
See application file for complete search history.

(56) References Cited

U.S. PATENT DOCUMENTS

| | | | | |
|---|---|---|---|---|
| 5,710,073 A * | 1/1998 | Jeng et al. | ................. | 438/239 |
| 2002/0098652 A1 * | 7/2002 | Mori et al. | ................. | 438/258 |
| 2004/0140510 A1 * | 7/2004 | Hazama | ................. | 257/390 |
| 2005/0023600 A1 * | 2/2005 | Shin et al. | ................. | 257/315 |
| 2006/0017111 A1 * | 1/2006 | Kamiya et al. | ................. | 257/368 |
| 2006/0223332 A1 * | 10/2006 | Jang et al. | ................. | 438/758 |

* cited by examiner

*Primary Examiner*—W. David Coleman
*Assistant Examiner*—Su C Kim
(74) *Attorney, Agent, or Firm*—Ingrassia Fisher & Lorenz, P.C.

(57) ABSTRACT

Methods for fabricating contacts to semiconductor structures are provided. A method comprises forming two members extending from a semiconductor substrate and separated by a portion of the substrate. First and second semiconductor devices are formed in and on the substrate and each comprise a common impurity doped region that is disposed within the portion of the substrate. A dielectric layer is deposited overlying the members, the semiconductor devices, and the common impurity doped region to a thickness such that a depression overlying the impurity doped region is formed. A fill material is deposited to substantially fill the depression and a portion of the dielectric layer is etched. A masking layer is deposited and a portion of the masking layer is removed to expose the fill material. A via is formed by etching the fill material and dielectric layer and a conductive material is deposited therein.

11 Claims, 13 Drawing Sheets

METHODS FOR FABRICATING SEMICONDUCTOR DEVICES AND CONTACTS TO SEMICONDUCTOR DEVICES

FIELD OF THE INVENTION

The present invention generally relates to semiconductor devices, and more particularly relates to methods for fabricating conductive contacts to semiconductor devices.

BACKGROUND OF THE INVENTION

Figure 1:
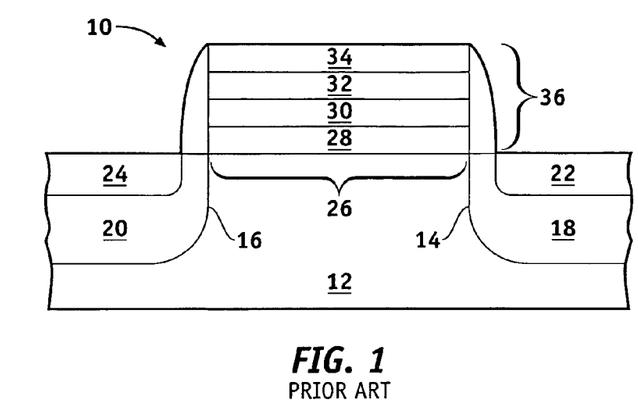
FIG. 1 is a cross-sectional view of a conventional flash EEPROM memory device with a floating gate.

Flash electrically erasable and programmable read-only memories (EEPROM's) are a class of nonvolatile memory devices that are programmed by hot electron injection and erased by Fowler-Nordheim tunneling. FIG. 1 is a cross-sectional view of a conventional flash EEPROM memory cell. The cell 10 is formed on a substrate 12, having a heavily doped drain region 14 and source region 16 embedded therein. The drain and source regions typically contain lightly doped deeply diffused regions 18, 20, respectively, and more heavily doped shallow diffused regions 22, 24, respectively, embedded into the substrate 12. A channel region 26 separates the drain region 14 and source region 16. The cell 10 typically is characterized by a vertical gate stack 36 of a tunnel oxide layer 28, a floating gate 30 over the tunnel oxide, an interlevel dielectric layer 32, and a control gate 34 over the interlevel dielectric layer.

Figure 2:
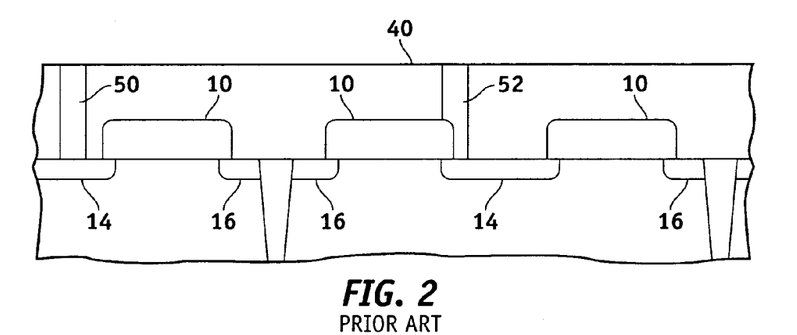
FIG. 2 is a cross-sectional view of conductive contacts electrically coupled to conventional flash EEPROM memory devices.

During IC fabrication, a conductive contact 50 is made to the control gate 34, source region 16, and/or the drain region 14 to access the memory device and allow interconnections between the memory device and other devices of the IC, as illustrated in FIG. 2. A conductive contact 50 is an opening through one or more insulating layers 40 that is subsequently filled with a conductive material to form a contact to a device region. The conductive material forming the contact, which often takes the form of a plug, may be tungsten or other metals. However, as the size of integrated circuit devices decreases, fabrication of the contacts to a memory device within the tolerances allowed by the relevant design rules becomes more difficult and has resulted in complex integration schemes for patterning, etching and filling to form the contacts. Misaligned contacts, such as contact 52, pose a significant challenge and can severely reduce device yield.

Accordingly, it is desirable to provide an improved method for forming a contact to a memory device that reduces complex overlay and masking steps. In addition, it is desirable to provide a method for forming a contact to a memory device that facilitates increased device density. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method is provided for fabricating a semiconductor device. The method comprises the steps of providing a semiconductor substrate and forming two members extending from the semiconductor substrate and separated by a portion of the semiconductor substrate. A first semiconductor device and a second semiconductor device are formed in and on the semiconductor substrate and each comprise a common impurity doped region that is disposed within the portion of the semiconductor substrate. A dielectric layer is deposited overlying the two members, the semiconductor devices, and the common impurity doped region to a thickness such that a depression overlying the impurity doped region is formed. A fill material is deposited overlying the dielectric layer to substantially fill the depression and a portion of the dielectric layer is etched. A masking layer is deposited overlying the dielectric layer and the fill material and a portion of the masking layer is removed to expose the fill material. The fill material and the dielectric layer are etched to form a via through the dielectric layer and a conductive material is deposited within the via such that the conductive material is electrically coupled to the impurity doped region.

A method for fabricating a semiconductor structure is also provided. The method comprises the steps of providing a substrate and forming two parallel members that extend from the substrate and that are separated by a first distance. Two semiconductor devices are formed on the substrate and are separated by a second distance. An impurity doped region is formed within the substrate and is electrically coupled to the two semiconductor devices. A dielectric layer is deposited overlying the two parallel members, the two semiconductor devices, and the impurity doped region and a fill material is deposited overlying the dielectric layer. The fill material has an etch rate that is different from the etch rate of the dielectric layer when subjected to an etch chemistry. The fill material is polished to expose a surface of the dielectric layer and the surface of the dielectric layer is etched. A masking layer is deposited overlying the dielectric layer and the fill material and a portion of the masking layer that overlies the fill material is removed to expose the fill material. The fill material and the dielectric layer overlying the impurity doped region are etched. A conductive material is deposited overlying the impurity doped region and in electrical contact with the impurity doped region.

A method for contacting a semiconductor device also is provided. The method comprises the steps of providing a substrate and forming two spacers disposed a first distance from each other and extending a second distance from the substrate. Two semiconductor devices are formed in and on the substrate and are disposed a third distance from each other. The two spacers and the two semiconductor devices form an area of the substrate that is substantially bounded by the two semiconductor devices and the two spacers. The area comprises an impurity doped region common to both semiconductor devices. A dielectric layer is conformally deposited overlying the two semiconductor devices, the two spacers, and the impurity doped region such that a depression in the dielectric layer is formed overlying the impurity doped region. The dimensions of the depression depend on the first distance, the second distance and the third distance. A fill material is deposited within the depression. A portion of the dielectric layer is etched with an etch chemistry that is selective to the fill material. A masking layer is deposited overlying the dielectric layer and the fill material and is polished to expose the fill material. The dielectric layer and the fill material are etched to form a via using the masking layer as a mask. A conductive contact is formed within the via.

BRIEF DESCRIPTION OF THE DRAWINGS

The present invention will hereinafter be described in conjunction with the following drawing figures, wherein like numerals denote like elements.

FIGS. 3-38 illustrate, in cross section, method steps for fabricating a conductive contact to a semiconductor device in accordance with exemplary embodiments of the present invention. In particular:

FIG. 3 is a top view of a semiconductor structure with spacers formed upon a substrate in accordance with various steps of an exemplary embodiment of the method of the present invention. FIG. 3 illustrates cross-sectional axes 4-4 and 5-5;

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

In accordance with an exemplary embodiment of the present invention, FIGS. 3-38 illustrate method steps for manufacturing a semiconductor structure 100 that provides contact to a semiconductor device, such as flash EEPROM memory cell 10, or any other suitable semiconductor device such as a transistor, a logic device, or the like. FIGS. 3-38 illustrate various top views and cross-sectional views of semiconductor structure 100. Various steps in the manufacture of semiconductor structure 100, including the semiconductor devices thereof, are well known and so, in the interest of brevity, many conventional steps will only be mentioned briefly herein or will be omitted entirely without providing well known process details.

Figure 3:
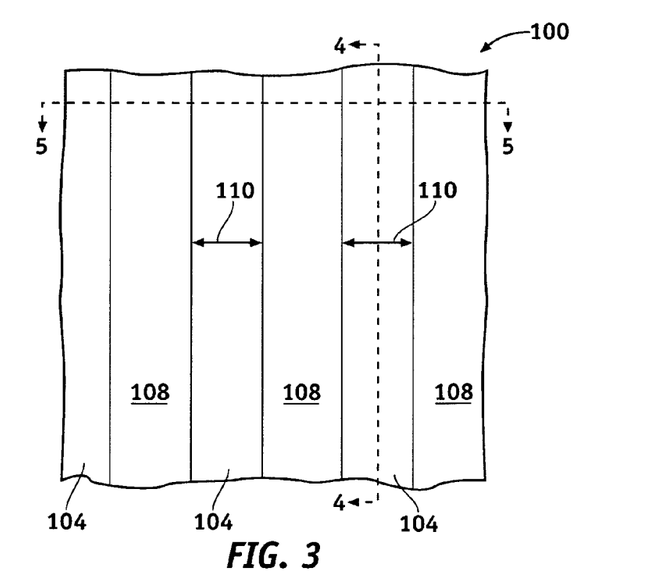
Figure 4:
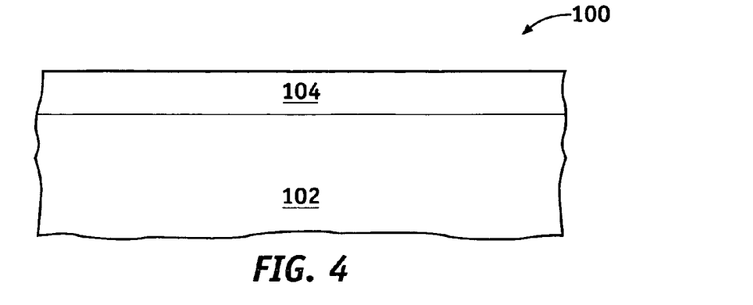
FIG. 4 is a cross-sectional view of the semiconductor structure of FIG. 3 taken along cross-sectional axis 4-4.
Figure 5:
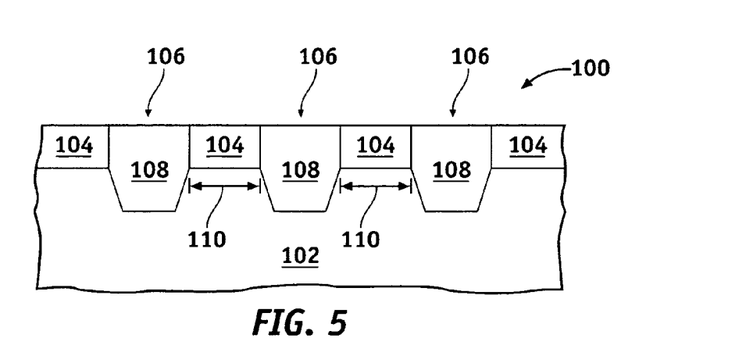
FIG. 5 is a cross-sectional view of the semiconductor structure of FIG. 3 taken along cross-sectional axis 5-5.

As illustrated in FIGS. 3-5, the manufacture of semiconductor structure 100 begins by providing a silicon substrate 102. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 102 may be a bulk silicon wafer or a thin layer of silicon on an insulating layer (commonly known as a silicon-on insulator wafer or SOI wafer) that, in turn, is supported by a silicon carrier wafer.

A silicon nitride layer 104 is deposited on the silicon substrate 102. The silicon nitride layer 104 can be deposited, for example, by low pressure chemical vapor deposition (LPCVD) or plasma enhanced chemical vapor deposition (PECVD) from the reaction of trichlorosilane or dichlorosilane and ammonia. As illustrated in more detail below, by controlling the thickness of the silicon nitride layer, a conductive contact can be formed to electrically couple a semiconductor device to an overlying conductive line while a sufficient amount of insulating material overlies the semiconductor device to insulate the semiconductor device from unrelated conductive lines. In one embodiment of the present invention, the silicon nitride layer 104 has a thickness in the range of about 200 nm to about 400 nm.

Figure 6:
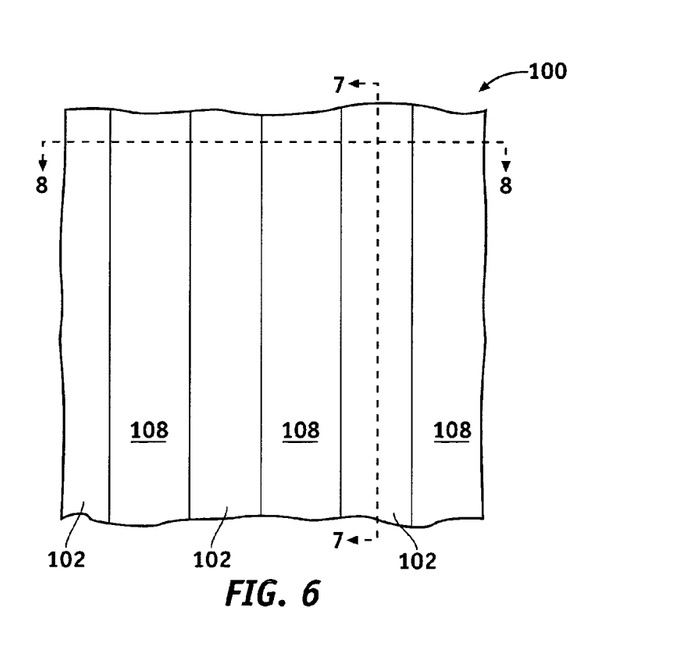
FIG. 6 is a top view of the semiconductor structure of FIG. 3 formed in accordance with additional steps of an exemplary embodiment of the method of the present invention.
Figure 7:
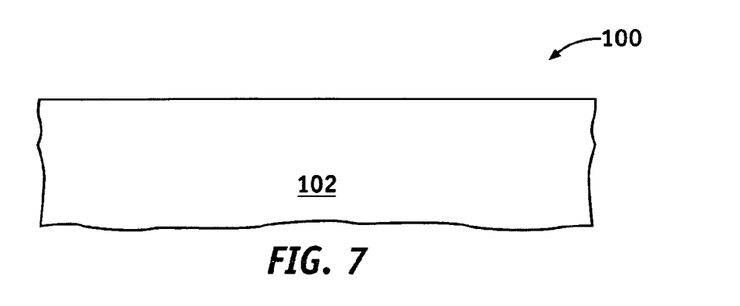
FIG. 7 is a cross-sectional view of the semiconductor structure of FIG. 6 taken along cross-sectional axis 7-7.
Figure 8:
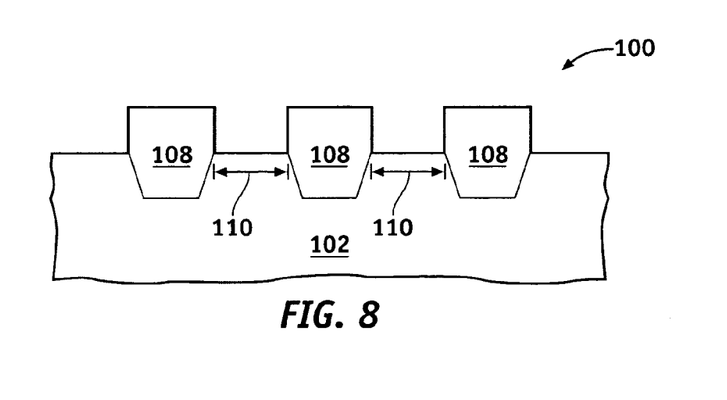
FIG. 8 is a cross-sectional view of the semiconductor structure of FIG. 6 taken along cross-sectional axis 8-8.
Figure 9:
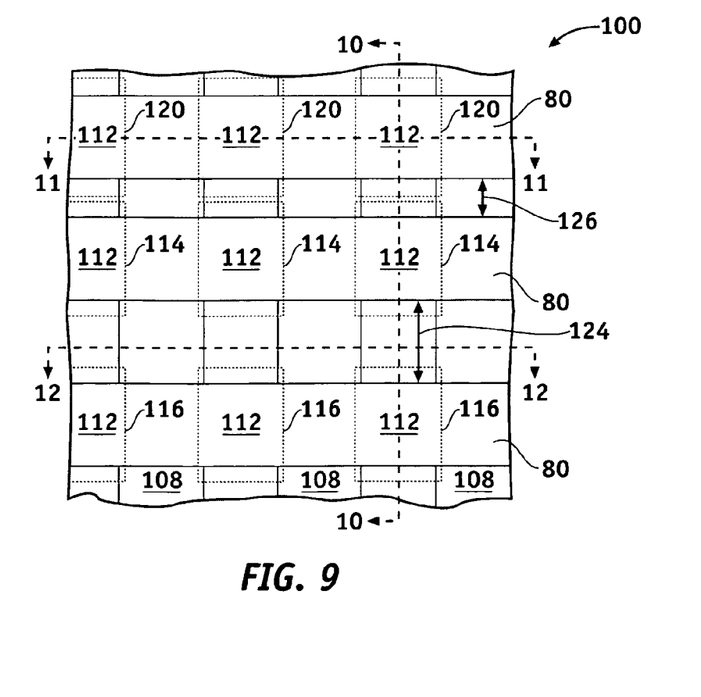
FIG. 9 is a top view of the semiconductor structure of FIG. 6 formed in accordance with additional steps of an exemplary embodiment of the method of the present invention.

A layer of photoresist (not shown) is applied to the surface of silicon nitride layer 104 and is photolithographically patterned to serve as an etch mask. Silicon nitride layer 104 then is etched to form a plurality of trenches 106 that are spaced apart a distance 110 and that extend into silicon substrate 102, as illustrated in FIG. 5. The trenches can be etched using any suitable etch chemistry conventionally used to form shallow trench isolation (STI). The photoresist layer is removed after completing the etching of trenches 106. Alternatively, the patterned photoresist layer can be removed after being used as an etch mask for the etching of silicon nitride 104. The etched layer of silicon nitride then can be used as a hard mask to mask the etching of silicon substrate 102. The trenches 106 are filled with deposited oxide or other insulator, for example, by LPCVD or PECVD, to form members or spacers 108. The deposited insulator fills trenches 106, but is also deposited onto silicon nitride layer 104. The excess insulator on silicon nitride layer 104 is polished back using chemical mechanical polishing (CMP) to complete the formation of STI, as illustrated in FIGS. 3-5. Referring to FIGS. 6-8, the silicon nitride then is removed, exposing silicon substrate 102 and leaving spacers 108 extending above the surface of substrate 102.

Figure 10:
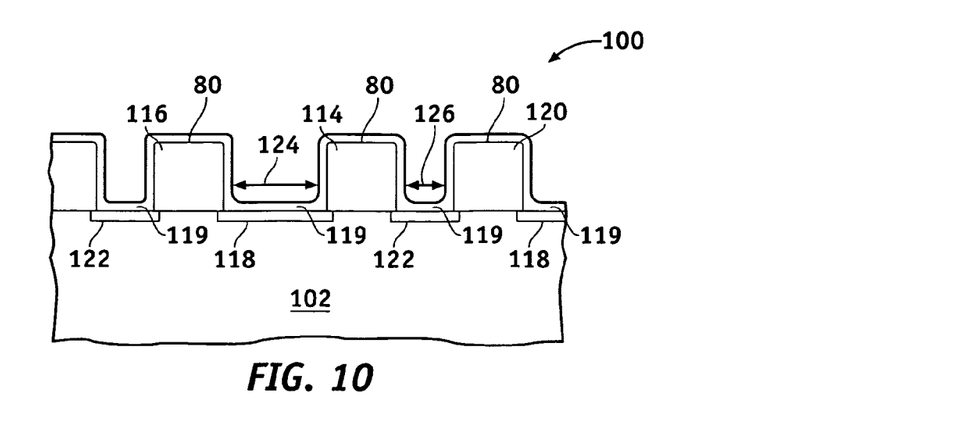
FIG. 10 is a cross-sectional view of the semiconductor structure of FIG. 9, taken along the cross-sectional axis 10-10.
Figure 11:
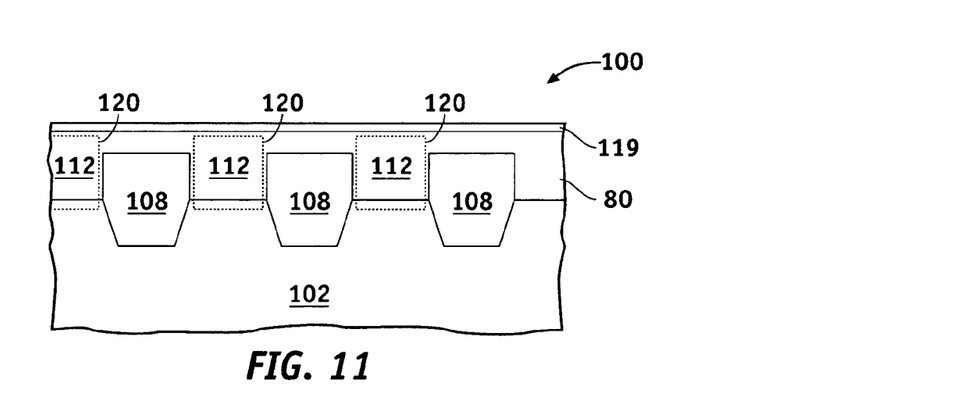
FIG. 11 is a cross-sectional view of the semiconductor structure of FIG. 9, taken along the cross-sectional axis 11-11.

Referring to FIGS. 9-12, a plurality of semiconductor devices 112, illustrated by dotted lines, is formed on the exposed silicon substrate 102 between the spacers 108. Semiconductor devices 112 may be flash EEPROM memory cells, such as flash EEPROM memory cells 10 of FIGS. 1 and 2, that comprise a vertical gate stack 80, a drain region 118, and a source region 122 or may be other suitable semiconductor devices, such as field effect transistors (FETs), logic devices, other memory devices, and the like. As illustrated in FIG. 10, two adjacent vertical gate stacks 80, such as a first gate stack 114 and a second gate stack 116, may be formed so that they share a first common impurity doped region, such as drain region 118 having a conductive contact (not shown), that is formed in silicon substrate 102 and to which contact is desired. First impurity doped region 118 may be formed in silicon substrate 102 in self-alignment with first and second gate stacks 114 and 116 or in any other conventional manner. Accordingly, first impurity doped region 118 is bounded by first and second gate stacks 114, 116 and two spacers 108. Because electrical contact will be made to first common impurity doped region 118, a distance indicated by double headed arrow 124 between first gate stack 114 and second gate stack 116 can be made sufficiently large to provide adequate space for the contact. However, as illustrated below, because the contact will be self-aligned, device density can be optimized without an increase in the number of misaligned contacts. In another exemplary embodiment of the invention, first semiconductor device 114 also may share a second common impurity doped region, such as source region 122, having a conductive contact (not shown), with an adjacent third semiconductor device 120. If contact will not be made to second common impurity doped region 122, a distance 126 between first semiconductor device 114 and third semiconductor device 120 can be minimized to increase and/or maximize device density.

In an optional embodiment of the invention, an etch stop layer 119 may be deposited overlying semiconductor structure 100. Preferably, etch stop layer 119 comprises a nitride layer, although etch stop layer may comprise any suitable etch stop material, and has a thickness of about 30 to about 50 nm. As described in more detail below, etch stop layer 119 may be used to protect first common impurity doped region 118 from subsequent etching processes.

A dielectric layer 128 is globally deposited overlying semiconductor structure 100, as illustrated in FIGS. 13-16. Dielectric layer 128 may comprise any suitable insulating material that can be deposited conformally. Preferably, dielectric layer 128 may be an oxide material, formed from a material such as tetraethyl orthosilicate (TEOS), silicon dioxide, and the like. In a more preferred embodiment of the invention, dielectric layer 128 is formed from TEOS. Dielectric layer 128 may be deposited by any suitable, well-known method such as LPCVD, PECVD, and the like. Dielectric layer 128 is sufficiently thin so that it conforms to the topography of semiconductor structure 100. However, as described in more detail below, dielectric layer 128 is deposited to a sufficient thickness indicated by double headed arrow 129 so that, upon formation of a contact to the first common impurity doped region 118, gate stacks 114 and 116 are sufficiently insulated from a subsequently formed unrelated conductive line that the conductive line does not interfere with or otherwise negatively affect the operation of the semiconductor devices.

Because dielectric layer 128 is deposited conformally, a plurality of depressions 130 of dielectric layer 128 forms between the various semiconductor devices 112 and the spacers 108. A deep depression 132 of the plurality of depressions 130 forms between first gate stack 114 and second gate stack 116 and overlies first common impurity doped region 118. As will be appreciated, the dimensions of depression 132, including a depth indicated by double headed arrow 134 of deep depression 132, are dependant upon the distance 110 between adjacent spacers 108, the distance 124 between gate stacks 114 and 116, a height 136 of spacers 108 as measured from silicon substrate 102, and the thickness 129 of dielectric layer 128. As is apparent from below, the dimensions and location of a contact to first common impurity doped region 118 can be manipulated by controlling distance 110, distance 124, height 136, and thickness 129 of dielectric layer 128. In one exemplary embodiment of the invention, distance 110 may be in the range of about 100 nm to about 200 nm, distance 124 may be in the range of about 100 nm to about 200 nm, height 136 may be in the range of about 200 nm to about 400 nm, and the thickness of dielectric layer 128 may be in the range of about 400 nm to about 800 nm.

Figure 17:
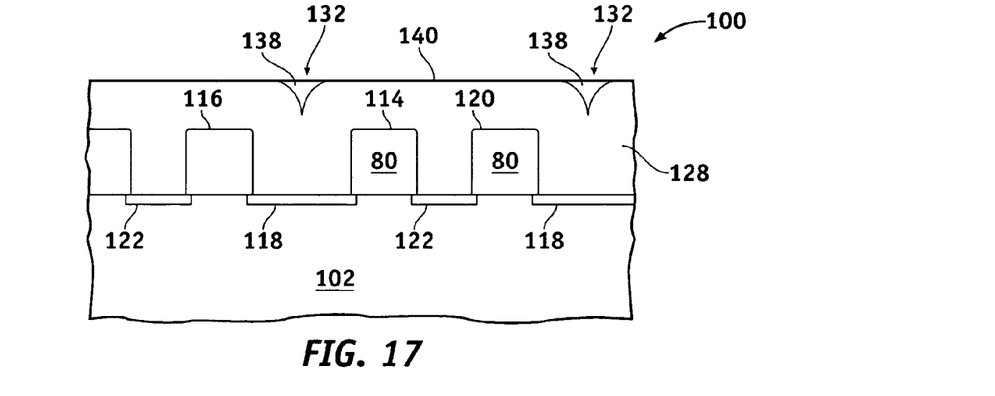
FIG. 17 is a cross-sectional view of the semiconductor structure of FIG. 14, formed in accordance with further steps of an exemplary embodiment of the method of the present invention.
Figure 18:
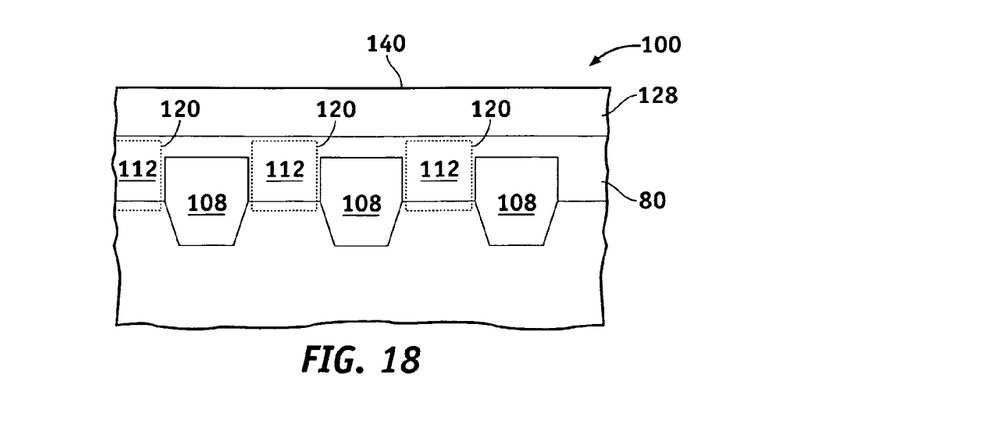
FIG. 18 is a cross-sectional view of the semiconductor structure of FIG. 15, taken along the same cross-sectional axis as FIG. 15, formed in accordance with the steps of FIG. 17.
Figure 19:
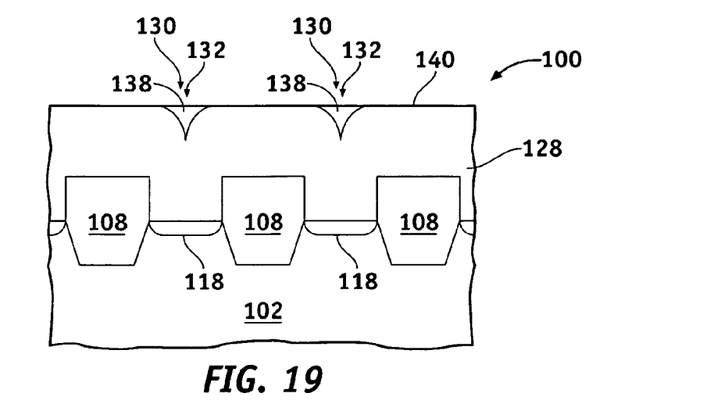
FIG. 19 is a cross-sectional view of the semiconductor structure of FIG. 16, taken along the same cross-sectional axis as FIG. 16, formed in accordance with the steps of FIG. 17.

Referring to FIGS. 17-19, a layer of fill material 138 is globally deposited overlying semiconductor structure 100, substantially filling depressions 130. FIGS. 17-19 illustrate semiconductor structure 100 along the same cross-sectional axes as FIGS. 14-16, respectively. Fill material 138 may comprise any suitable material that has an etch rate that is slower than the etch rate of dielectric layer 128 when subjected to the same etch chemistry. In an embodiment of the invention, fill material 138 may comprise a silicon nitride deposited by PECVD, LPCVD, or any other suitable method. In another embodiment, fill material 138 may comprise tungsten/titanium nitride (W/TiN), that is, a TiN barrier layer, preferably with a thickness of about 10 nm to about 30 nm, with a W core. The W/TiN may be deposited by CVD, PECVD, or the like. It will be appreciated, however, that the invention is not limited to silicon nitride or W/TiN and that any suitable fill material may be used. Any excess fill material 138 deposited outside depressions 130 and overlying dielectric layer 128 may be removed, such as by etching or, preferably, CMP to expose a surface 140 of dielectric layer 128. In a preferred embodiment of the invention, the CMP is continued for a time such that the shallow depressions 130 that do not overlie first common impurity doped region 118, and the fill material 138 therein, are removed, while deep depressions 132, and the fill material 138 therein, remain.

In an alternative embodiment, before deposition of fill material 138, dielectric layer 128 may be subjected to CMP to remove shallow depressions 130 that do not overlie first common impurity doped region 118, while leaving at least a portion of deep depressions 132 in tact. Fill material 138 then may be deposited to fill deep depressions 132. Any excess fill material deposited outside deep depressions 132 and overlying dielectric layer 128 may be removed, such as by etching or, preferably, CMP to expose surface 140 of dielectric layer 128.

Figure 20:
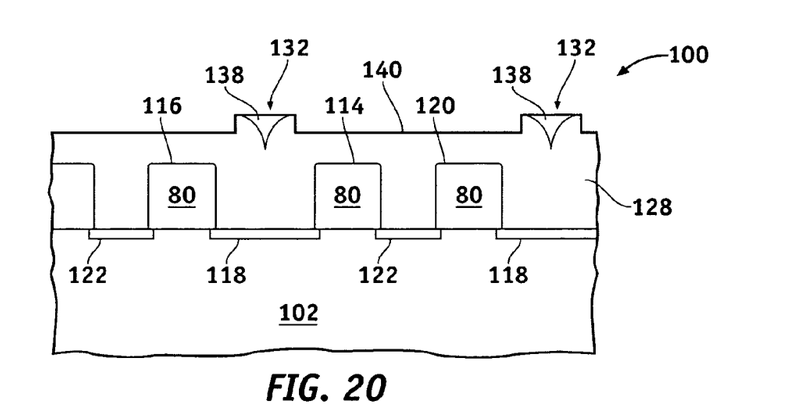
FIG. 20 is a cross-sectional view of the semiconductor structure of FIG. 17, formed in accordance with further steps of an exemplary embodiment of the method of the present invention.
Figure 21:
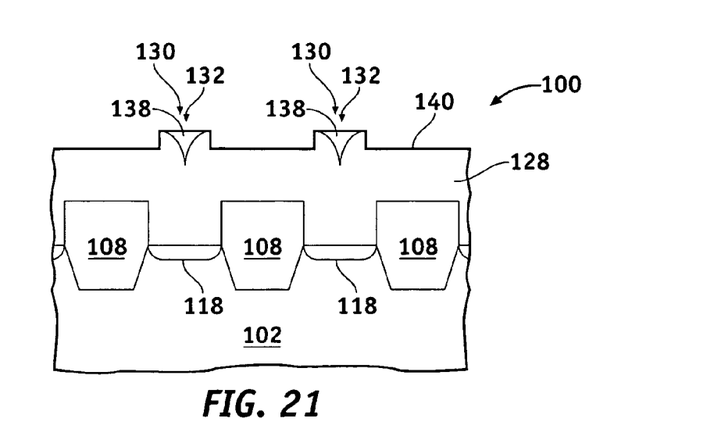
FIG. 21 is a cross-sectional view of the semiconductor structure of FIG. 19, taken along the same cross-sectional axis as FIG. 19, formed in accordance with the steps of FIG. 20.

Referring to FIGS. 20 and 21, fill material 138 and dielectric layer 128 then are etched such that dielectric layer 128 is etched at a faster rate than fill material 138. FIGS. 20 and 21 illustrate semiconductor structure 100 along the same cross-sectional axes as FIGS. 17 and 19, respectively. If dielectric layer 128 is a silicon oxide and fill material 138 is silicon nitride, the dielectric layer and the fill material can be etched, for example, by plasma etching using a $C_4F_8$ chemistry. A portion of dielectric layer 128 is removed by the etching process, resulting in at least a portion of fill material 138 extending from depressions 132 beyond surface 140 of dielectric layer 128. In a preferred embodiment of the invention, a thickness of about 30 nm to 200 nm is removed from surface 140 of dielectric layer 128. As described above, a thickness of dielectric layer 128 remains overlying gate stacks 80 of semiconductor devices 112 to insulate semiconductor devices 112 from a subsequently formed conductive line.

Figure 22:
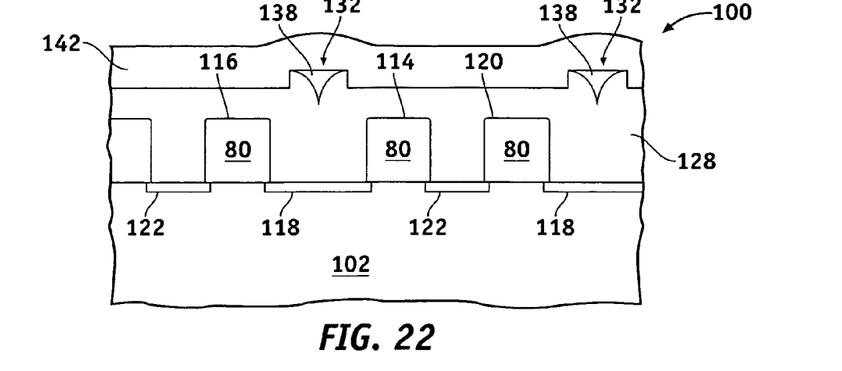
FIG. 22 is a cross-sectional view of the semiconductor structure of FIG. 20, formed in accordance with further steps of an exemplary embodiment of the method of the present invention.
Figure 23:
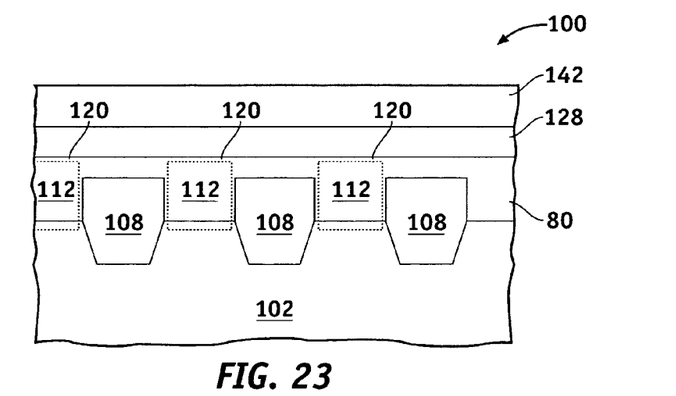
FIG. 23 is a cross-sectional view of the semiconductor structure of FIG. 18, taken along the same cross-sectional axis as FIG. 18, formed in accordance with the steps of FIG. 22.
Figure 24:
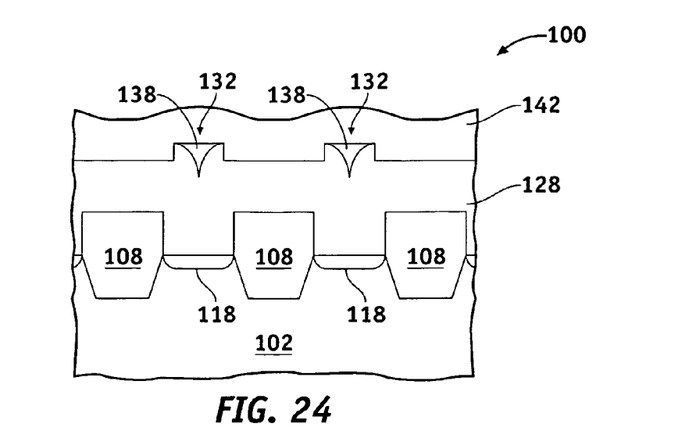
FIG. 24 is a cross-sectional view of the semiconductor structure of FIG. 21, taken along the same cross-sectional axis as FIG. 21, formed in accordance with the steps of FIG. 22.
Figure 25:
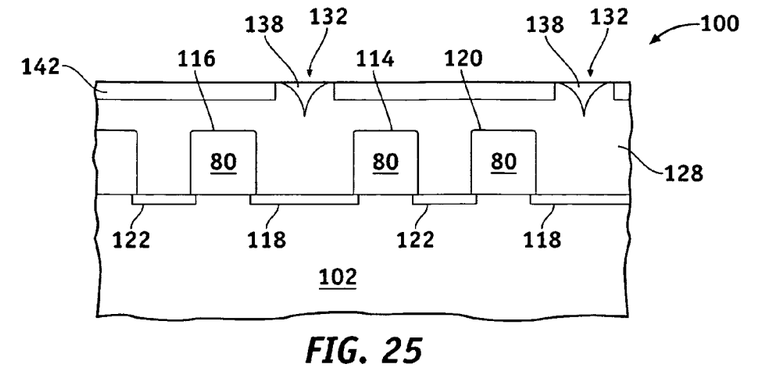
FIG. 25 is a cross-sectional view of the semiconductor structure of FIG. 22, taken along the same cross-sectional axis as FIG. 22, formed in accordance with further steps of an exemplary embodiment of the method of the present invention.
Figure 26:
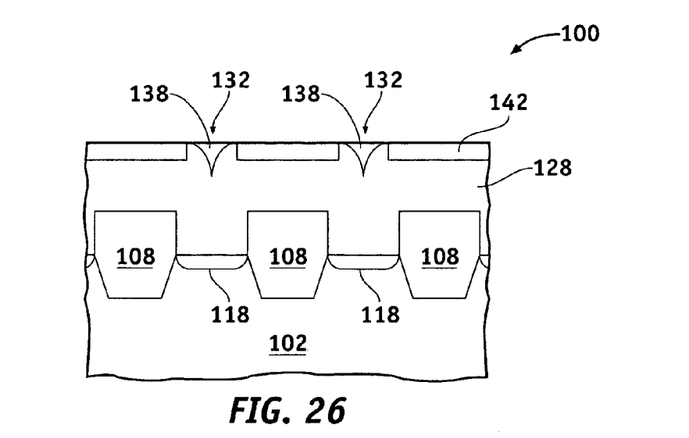
FIG. 26 is a cross-sectional view of the semiconductor structure of FIG. 24, formed in accordance with further steps of FIG. 25.

As illustrated in FIGS. 22-24, a masking layer 142 is deposited overlying semiconductor structure 100. FIGS. 22-24 illustrate semiconductor structure 100 along the same cross-sectional axes as FIGS. 17-19, respectively. Masking layer 142 may comprise any material that etches at a slower rate than the etch rates of dielectric layer 128 and fill material 138 when subjected to the same etch chemistry. Masking layer 142 may comprise amorphous silicon, polysilicon, or any other suitable masking material. The masking layer may be deposited by any suitable known method and preferably is deposited to a thickness of about 60 nm to about 120 nm. After deposition of masking layer 142, a portion of masking layer 142 is removed, preferably by CMP, to expose fill material 138, as illustrated in FIGS. 25 and 26. FIGS. 25 and 26 illustrate semiconductor structure 100 along the same cross-sectional axes as FIGS. 22 and 24, respectively. Masking layer 142 thus is self aligned to fill material 138.

Figure 27:
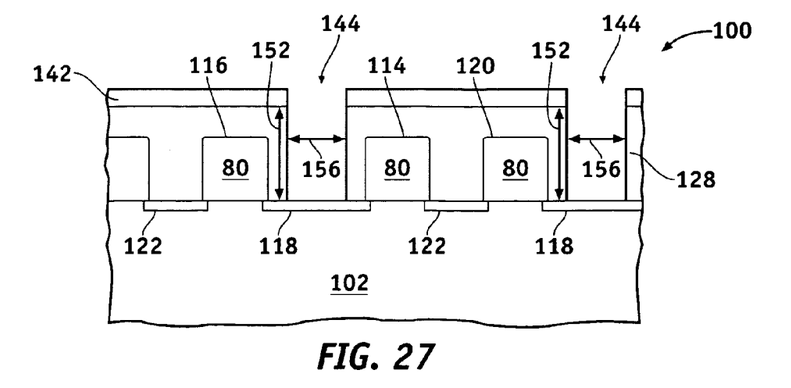
FIG. 27 is a cross-sectional view of the semiconductor structure of FIG. 25, formed in accordance with further steps of an exemplary embodiment of the method of the present invention.
Figure 28:
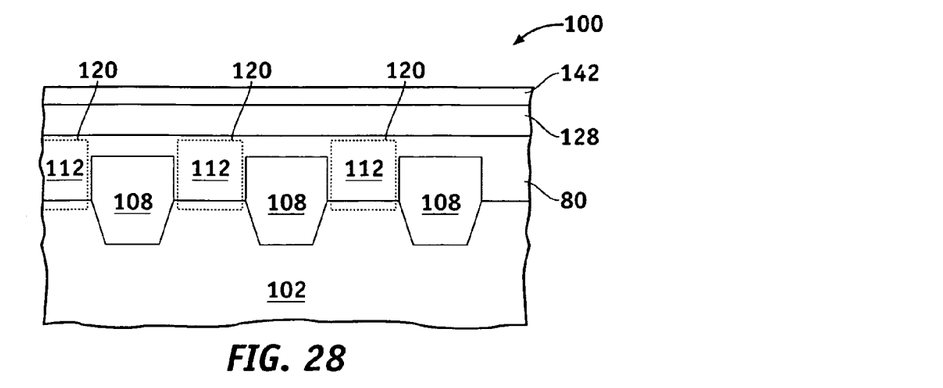
FIG. 28 is a cross-sectional view of the semiconductor structure of FIG. 23, taken along the same cross-sectional axis as FIG. 23, formed in accordance with the steps of FIG. 27.
Figure 29:
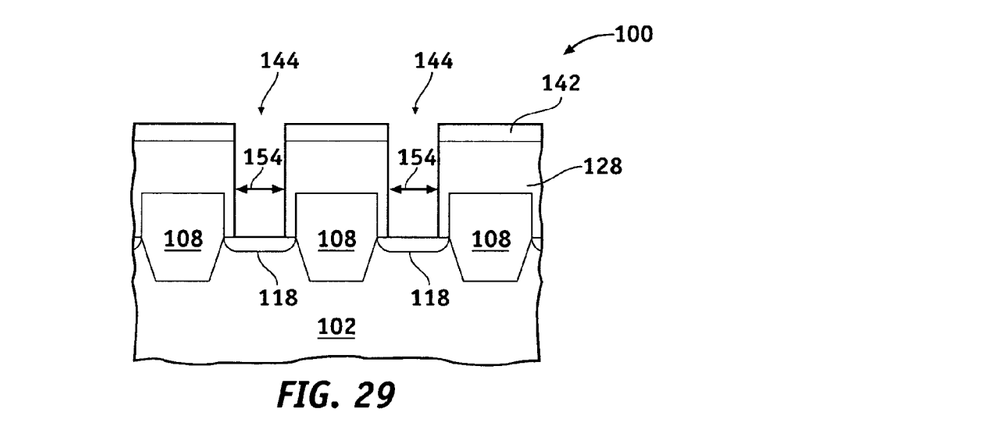
FIG. 29 is a cross-sectional view of the semiconductor structure of FIG. 26, taken along the same cross-sectional axis as FIG. 26, formed in accordance with the steps of FIG. 27.

Fill material 138 within depressions 132 and dielectric layer 128 are etched until a via 144 is formed through dielectric layer 128, as illustrated in FIGS. 27-29. FIGS. 27-29 illustrate semiconductor structure 100 along the same cross-sectional axes as FIGS. 22-24, respectively. The etching chemistry may be any known etching chemistry that is selective to masking layer 142. In an exemplary embodiment of the invention, an etch stop layer such as etch stop layer 119 of FIG. 12, overlies first common impurity doped region 118 to protect it from the etching chemistry. Masking layer 142 serves as a self aligned etch mask during the etching process and the etching process is continued until first common impurity doped region 118, a conductive contact (not shown) electrically coupled thereto, or etch stop layer 119 is exposed. As noted above, masking layer 142 is self aligned to fill material 138. The dimensions of fill material 138 are dependant upon the dimensions of depression 132, which in turn are dependant upon the distance 110 between adjacent spacers 108, the distance 124 between gate stacks 114 and 116, height 136 of spacers 108, and the thickness 129 of dielectric layer 128, as illustrated in FIGS. 13-16. Accordingly, dimensions of via 144, such as a width indicated by double headed arrow 156, a depth indicated by double headed arrow 152, and a length indicated by double headed arrow 154, are dependant on the same factors as depression 132.

Figure 33:
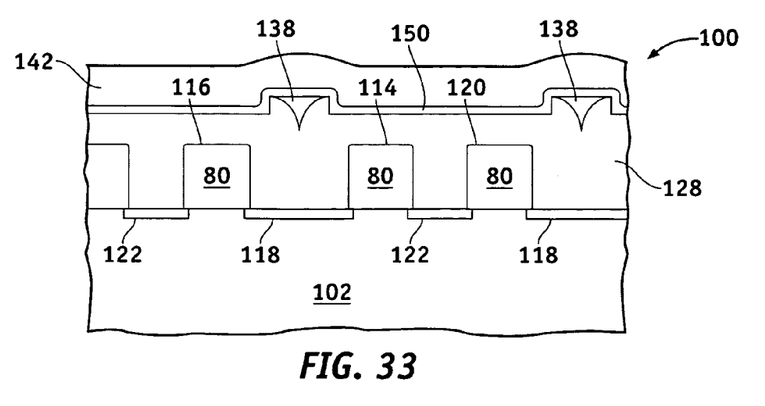
FIG. 33 is a cross-sectional view of the semiconductor structure of FIG. 20, formed in accordance with further steps of an exemplary embodiment of the method of the present invention.
Figure 34:
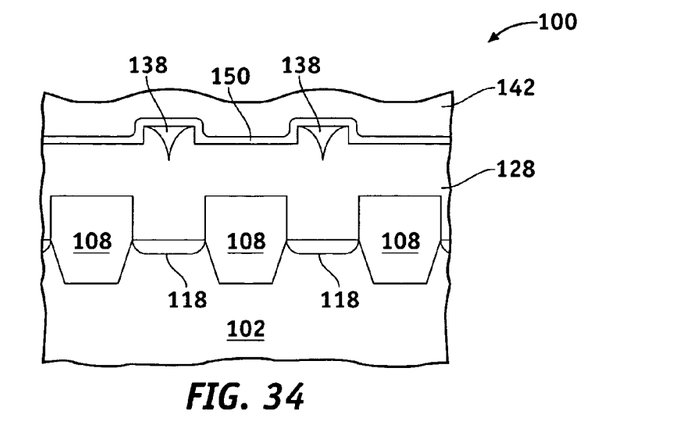
FIG. 34 is a cross-sectional view of the semiconductor structure of FIG. 21, taken along the same cross-sectional axis as FIG. 21, formed in accordance with the steps of FIG. 33.

Referring momentarily to FIGS. 33-34, in an optional embodiment of the invention, after the etching of fill material 138 and dielectric layer 128 as illustrated in FIGS. 20 and 21, and prior to the deposition of masking layer 142, a layer of spacer material 150 may be conformally deposited with a thickness of about 5 to 100 nm overlying dielectric material 128 and about the extended portions of fill material 138 and any residual dielectric material 128 remaining about the extended portions of fill material 138. FIGS. 33 and 34 illustrate semiconductor structure 100 along the same cross-sectional axes as FIGS. 20 and 21, respectively. Spacer material 150 may be used to increase the width of a subsequently formed contact. Spacer material 150 may be formed of any suitable material that etches at a faster rate than the etch rate of masking layer 142 when subjected to the same etch chemistry. For example, spacer material 150 may be formed of a nitride, an oxide, an oxynitride, or the like, by PECVD, LPCVD, or the like. Masking layer 142 then may be deposited overlying spacer material 150 to a suitable thickness.

Figure 35:
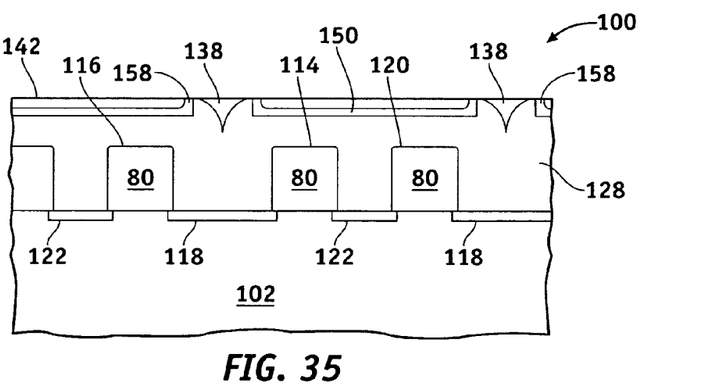
FIG. 35 is a cross-sectional view of the semiconductor structure of FIG. 33, formed in accordance with further steps of an exemplary embodiment of the method of the present invention.
Figure 36:
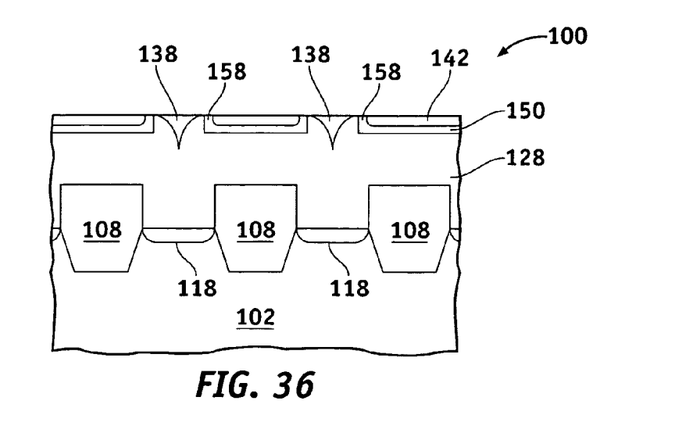
FIG. 36 is a cross-sectional view of the semiconductor structure of FIG. 34, taken along the same cross-sectional axis as FIG. 34, formed in accordance with the steps of FIG. 35.

Following the deposition of masking layer 142, a portion of masking layer 142 is removed, preferably by CMP, to expose fill material 138 while remaining overlying spacers 108, as illustrated in FIGS. 35 and 36. FIGS. 35 and 36 illustrate semiconductor structure 100 along the same cross-sectional axes as FIGS. 33 and 34, respectively. Upon exposure of fill material 138, a sidewall spacer 158 of spacer material 150 is formed about the extended portion of fill material 138 and any of dielectric layer 128 about the extended portion of fill material 138. Fill material 138 within depressions 132, sidewall spacers 158, and dielectric layer 128 then are etched until via 144 is formed. The process may continue as described above with reference to FIGS. 27-32. Accordingly, because mask layer 142 is self-aligned with sidewall spacers 158, the width 156 and length 154 of via 144 may be increased beyond the corresponding dimensions of fill material 138 upon etching of fill material 138, residual dielectric layer 128, and spacer material 150.

Figure 37:
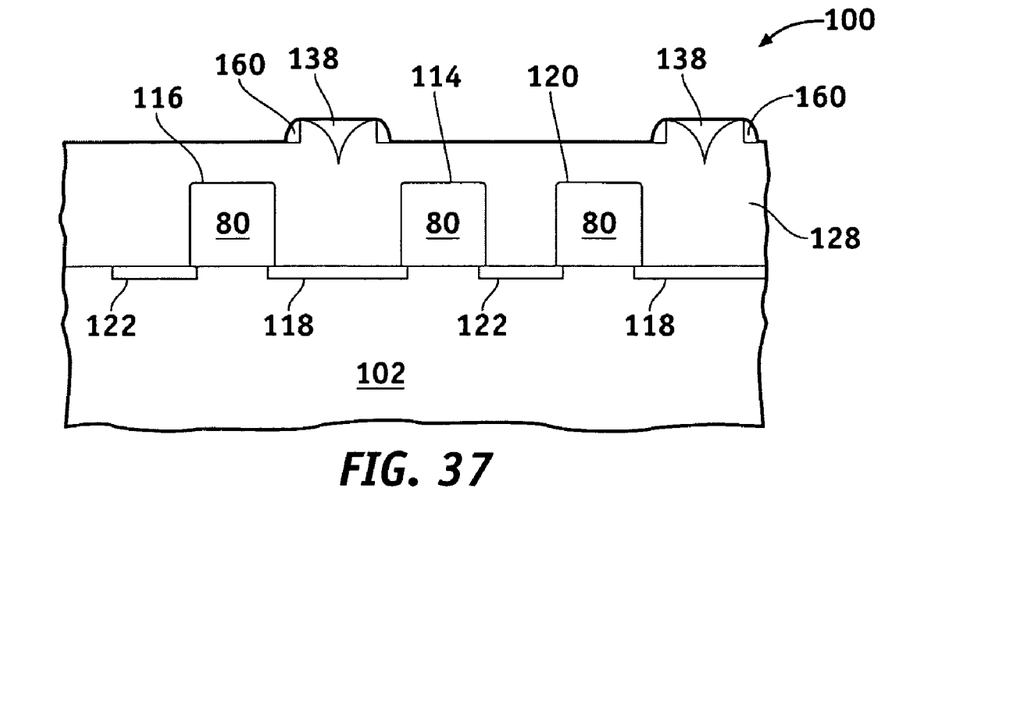
FIG. 37 is a cross-sectional view of the semiconductor structure of FIG. 20, formed in accordance with further steps of an exemplary embodiment of the method of the present invention.
Figure 38:
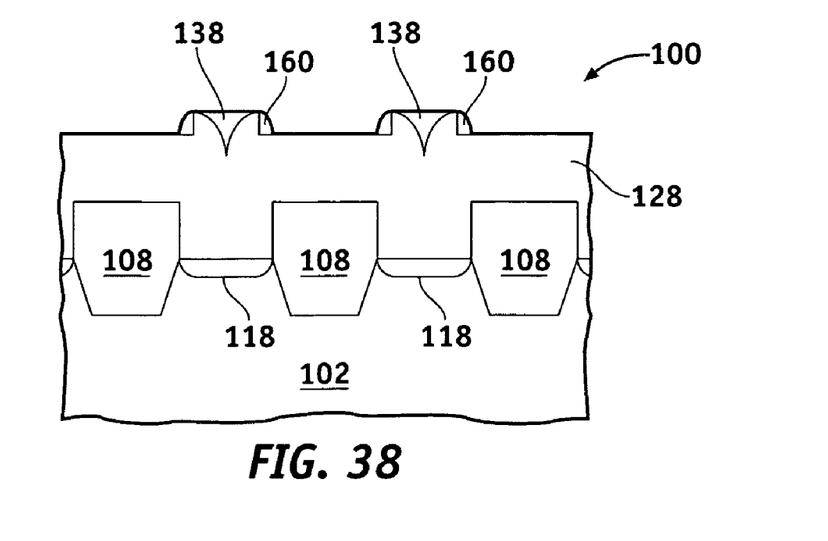
FIG. 38 is a cross-sectional view of the semiconductor structure of FIG. 21, taken along the same cross-sectional axis as FIG. 21, formed in accordance with the steps of FIG. 37.

In an alternative embodiment, as illustrated in FIGS. 37-38, before the deposition of masking layer 142, the spacer material 150 may be deposited to a thickness that covers fill material 138. The spacer material 150 then may be etched using any suitable etch chemistry that is selective to dielectric layer 128, such as $CH_3F/O_2$, to form sidewall spacers 160. Masking layer 142 then may be deposited to a suitable thickness, as described above.

Following the deposition of masking layer 142, a portion of masking layer 142 is removed, preferably by CMP, to expose fill material 138 and sidewall spacers 160 while remaining overlying spacers 108. Fill material 138 within depressions 132, sidewall spacers 160, and dielectric layer 128 are etched until via 144 is formed. The process then may continue as described above with reference to FIGS. 27-32. Accordingly, because mask layer 142 is self-aligned with sidewall spacers 160, the width 156 and length 154 of via 144 may be increased beyond the corresponding dimensions of fill material 138 upon etching of fill material 138, residual dielectric layer 128, and sidewall spacers 158.

Figure 12:
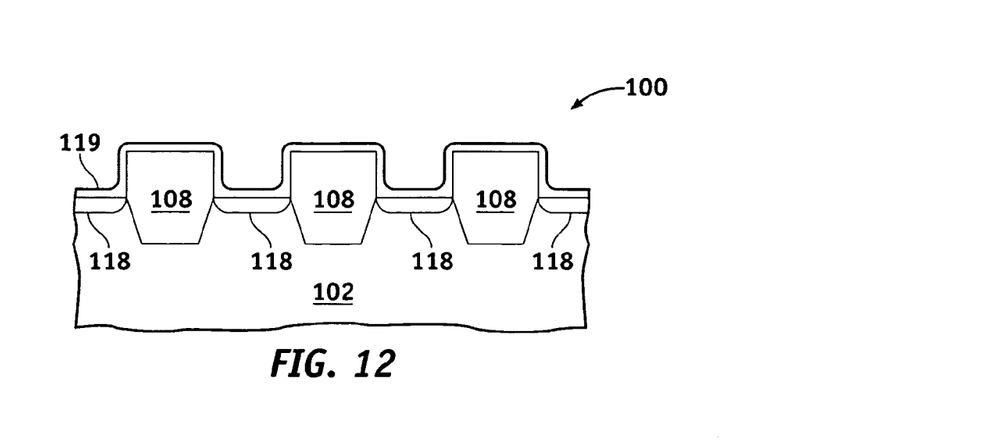
FIG. 12 is a cross-sectional view of the semiconductor structure of FIG. 9, taken along the cross-sectional axis 12-12.
Figure 13:
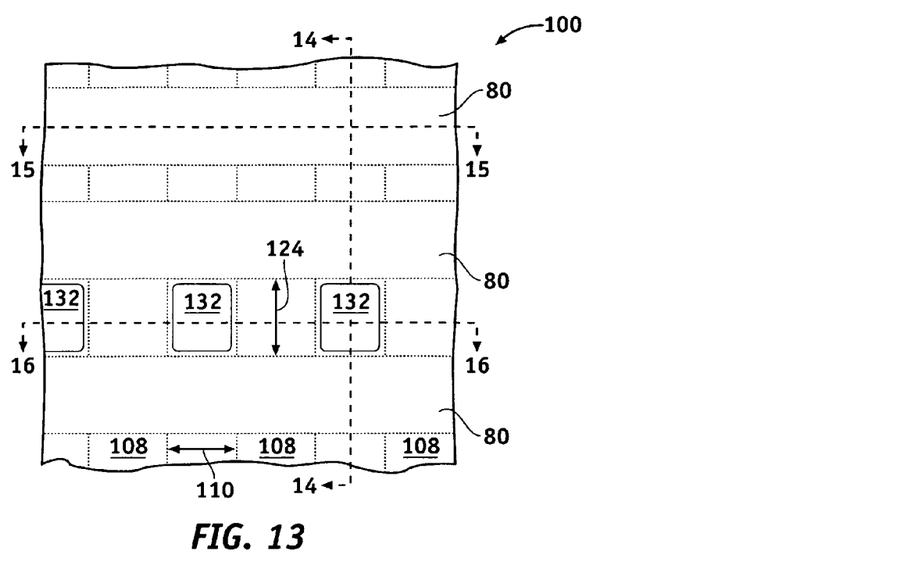
FIG. 13 is a top view of the semiconductor structure of FIG. 9 formed in accordance with additional steps of an exemplary embodiment of the method of the present invention.
Figure 14:
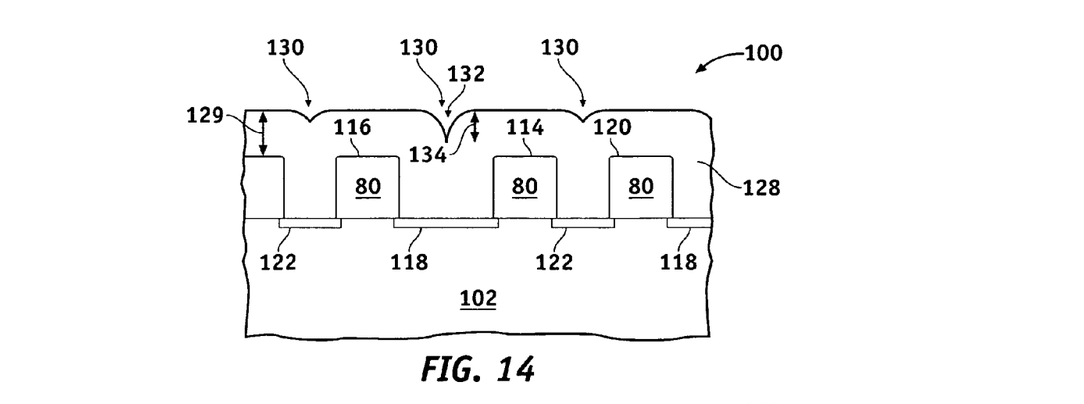
FIG. 14 is a cross-sectional view of the semiconductor structure of FIG. 13, taken along the cross-sectional axis 14-14.
Figure 15:
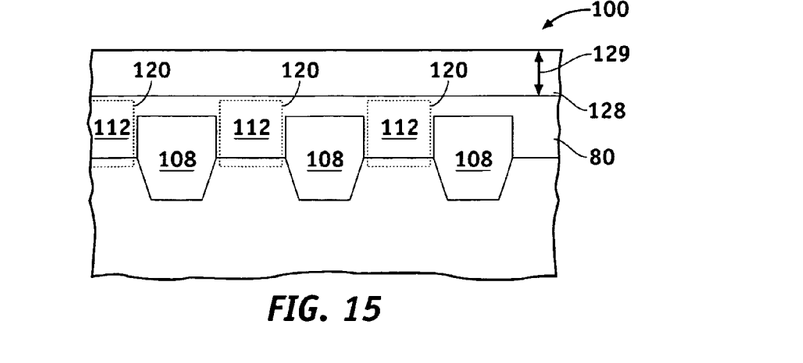
FIG. 15 is a cross-sectional view of the semiconductor structure of FIG. 13, taken along the cross-sectional axis 15-15.
Figure 16:
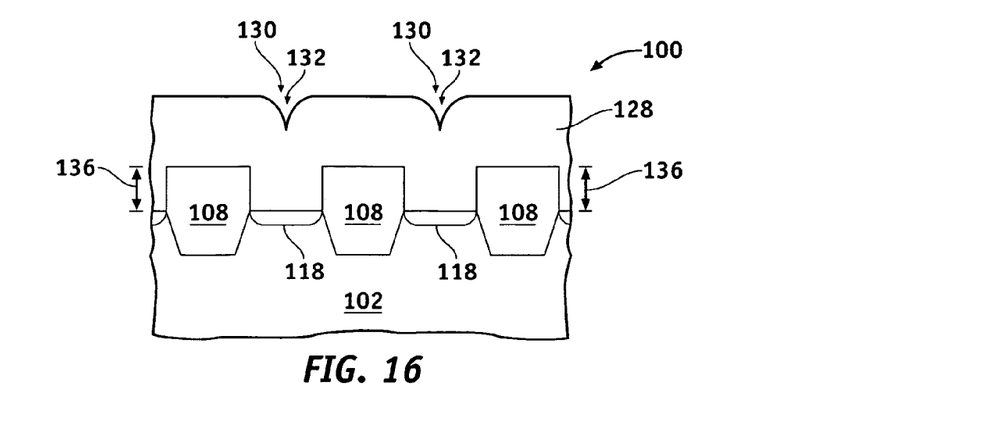
FIG. 16 is a cross-sectional view of the semiconductor structure of FIG. 13, taken along the cross-sectional axis 16-16.
Figure 30:
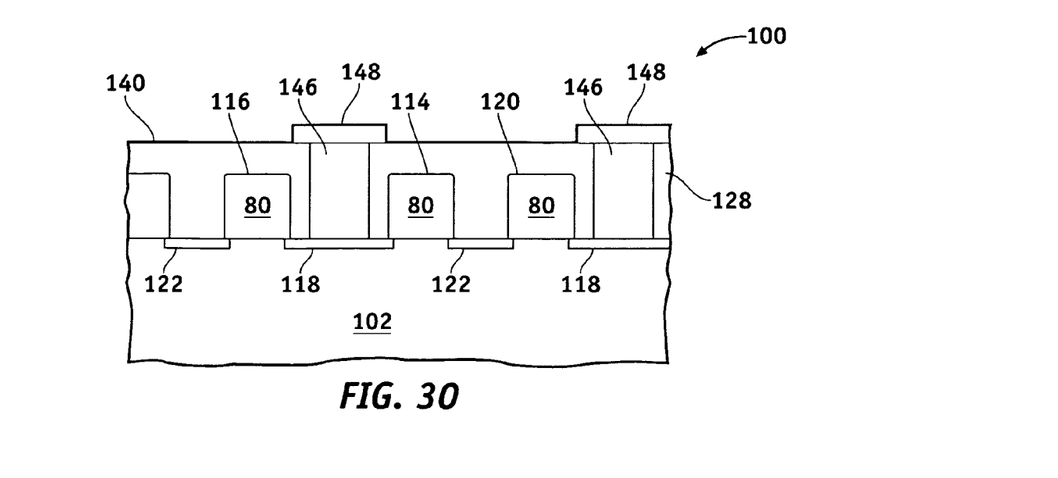
FIG. 30 is a cross-sectional view of the semiconductor structure of FIG. 27, formed in accordance with further steps of an exemplary embodiment of the method of the present invention.
Figure 31:
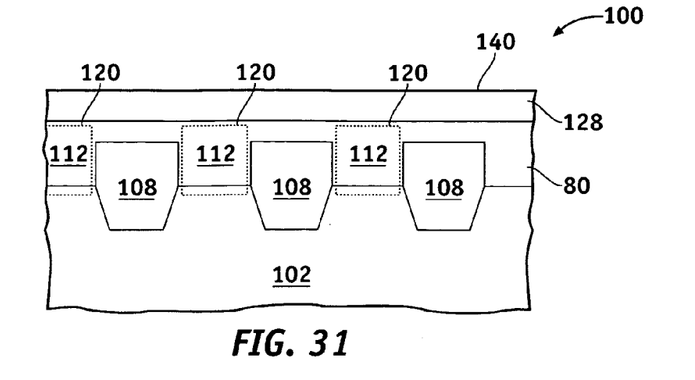
FIG. 31 is a cross-sectional view of the semiconductor structure of FIG. 28, taken along the same cross-sectional axis as FIG. 28, formed in accordance with the steps of FIG. 30.
Figure 32:
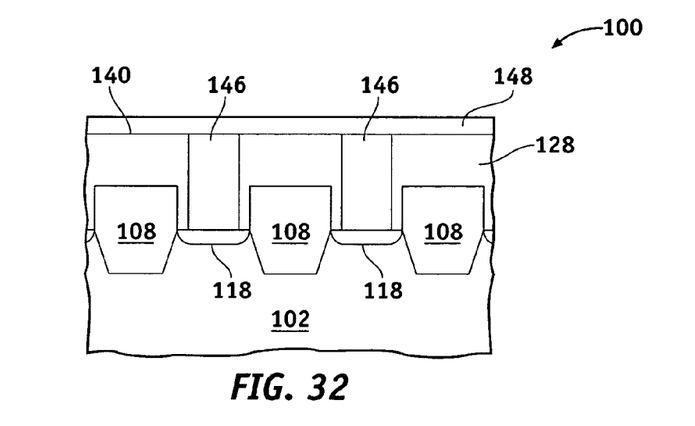
FIG. 32 is a cross-sectional view of the semiconductor structure of FIG. 29, taken along the same cross-sectional axis as FIG. 29, formed in accordance with the steps of FIG. 30.

Referring now to FIGS. 30-32, following the formation of via 144, one or more conductive materials may be deposited within via 144 to form a conductive contact 146 that is electrically coupled to first impurity doped region 118. In an exemplary embodiment of the present invention, a metal, such as tungsten (W), aluminum (Al), copper (Cu), gold (Au), silver (Ag), or the like, or alloys thereof, may be deposited within via 144. In another exemplary embodiment of the present invention, the conductive contact 146 may be fabricated by depositing a barrier layer, a seed layer, and a conductive core material, as is well known. The barrier layer may be formed of tantalum (Ta), tantalum nitride (TaN), tantalum silicon nitride (TaSiN), cobalt (Co), titanium nitride (TiN), ruthenium (Ru), rhodium (Rh), palladium (Pd), or any other suitable metal that hinders or prevents the ability of the conductive core material from diffusing into or otherwise adversely reacting with surrounding materials. The barrier layer may be deposited using physical vapor deposition (PVD), ionized metal plasma (IMP), chemical vapor deposition (CVD), or any other suitable technique known in the semiconductor industry. The seed layer may be deposited using PVD, IMP, CVD or any other suitable technique known in the semiconductor industry. Next, the conductive core may be formed by electroplating deposition, PVD, IMP, CVD, or any other suitable method. The seed layer and the conductive core may be comprised of tungsten (W), copper (Cu), aluminum (Al), gold (Au), silver (Ag), and the like, or any combined alloy thereof. After deposition of the conductive core material, any excess metal may be removed from the surface 140 of dielectric layer 128 such as by CMP or the like. In one exemplary embodiment of the present invention, masking layer 142 may be removed after the removal of the excess metal overlying surface 140. In another exemplary embodiment of the invention, if an etch stop layer, such as etch stop layer 119 of FIG. 12, is present to protect first common impurity doped region 118, masking layer 142 may be removed before deposition of the materials forming conductive contact 146. The etch stop layer then may be removed After surface 140 of dielectric layer 128 is exposed, a conductive interconnect 148 then may be formed overlying surface 140 of dielectric layer 128 to electrically couple semiconductor devices 112 to other devices, lines, or other features of the integrated circuit via conductive contact 146. As illustrated in FIGS. 30 and 32, semiconductor devices 112 are insulated from conductive interconnect 148 by dielectric layer 128.

Accordingly, a method for fabricating a semiconductor structure that provides a self-aligned contact to a semiconductor device is provided. The method reduces the masking and photolithography steps required to form the contact and eliminates misalignment problems associated with lithography of small contacts. The dimensions and locations of the contacts may be manipulated by manipulating the distance between adjacent semiconductor devices, the distance between adjacent spacers, and the height of the spacers.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor structure, the method comprising the steps of:
   providing a semiconductor substrate;
   forming two members extending from said semiconductor substrate, wherein said two members are separated by a portion of said semiconductor substrate;
   forming a first semiconductor device and a second semiconductor device in and on said semiconductor substrate, wherein said first and second semiconductor devices each comprise a common impurity doped region that is disposed within said portion of said semiconductor substrate;
   depositing a dielectric layer overlying said two members, said first and second semiconductor devices, and said common impurity doped region to a thickness such that a depression within said dielectric layer and overlying said common impurity doped region is formed;
   depositing a fill material to at least substantially fill said depression;
   etching a portion of said dielectric layer after the step of depositing said fill material such that said dielectric layer is etched at a faster rate than said fill material;
   depositing a masking layer overlying said dielectric layer and said fill material;
   removing a portion of said masking layer to expose said fill material and form an etch mask that is self-aligned to said fill material;
   etching said fill material and said dielectric layer using said etch mask to form a via through said dielectric layer;
   depositing a conductive material within said via such that said conductive material is electrically coupled to said impurity doped region.

2. The method of claim 1, wherein the step of forming two members comprises the steps of:
   depositing a silicon nitride layer overlying said silicon substrate;
   etching said silicon nitride layer to form two trenches disposed therein;

depositing an insulating material within said trenches; and removing said silicon nitride layer.

3. The method of claim 1, wherein the step of forming a first semiconductor device and a second semiconductor device comprises the step of forming a first flash EEPROM memory device and a second flash EEPROM memory device.

4. The method of claim 1, wherein the first semiconductor device has a first gate stack and the second semiconductor device has a second gate stack and wherein the step of forming a first semiconductor device and a second semiconductor device comprises the step of forming said first gate stack a distance from said second gate stack, wherein said depression has a first dimension that depends, at least in part, on said distance, and wherein the step of etching said fill material and said dielectric layer to form a via comprises the step of etching to form said via with a second dimension depending on said first dimension.

5. The method of claim 1, wherein the step of forming two members comprises the step of forming said two members a distance from each other and wherein the step of etching said fill material and said dielectric layer to form a via comprises the step of etching said via with a dimension depending on said distance.

6. The method of claim 1, wherein the step of forming two members comprises the step of forming said two members that extend a distance from said silicon substrate and wherein the step of etching said fill material and said dielectric layer to form a via comprises the step of etching said via with a dimension that depends on said distance.

7. The method of claim 1, wherein the step of depositing a fill material comprises the step of depositing said fill material overlying a surface of said dielectric layer, and wherein the method further comprises the step of removing a portion of said fill material to expose said dielectric layer.

8. The method of claim 1, further comprising the step of forming a spacer about a portion of said fill material after the step of etching a portion of said dielectric layer and before the step of depositing a masking layer.

9. The method of claim 1, further comprising the step of removing a portion of said dielectric layer before the step of depositing a fill material.

10. The method of claim 1, wherein the step of depositing a fill material comprises the step of depositing a silicon nitride or the step of depositing a TiN barrier layer followed by depositing a W core.

11. The method of claim 1, further comprising the step of depositing an etch stop layer overlying said common impurity doped region before the step of depositing a dielectric layer.

* * * * *